United States Patent [19]
Nakatsuka et al.

[11] Patent Number: 5,689,207
[45] Date of Patent: Nov. 18, 1997

[54] FRONT-END CIRCUIT

[75] Inventors: Tadayoshi Nakatsuka, Toyonaka; Jyunji Itoh, Hirakata, both of Japan

[73] Assignee: Matsushita Electric Industrial Co., Ltd., Kadoma, Japan

[21] Appl. No.: 631,791

[22] Filed: Apr. 12, 1996

[30] Foreign Application Priority Data

Apr. 12, 1995 [JP] Japan .................... 7-086842

[51] Int. Cl.$^6$ .................................................. G06G 7/12
[52] U.S. Cl. .................................. 327/355; 327/40
[58] Field of Search ........................ 455/323, 333; 327/355, 356–363, 39–46, 113–116

[56] References Cited

U.S. PATENT DOCUMENTS

| | | | |
|---|---|---|---|
| 4,572,975 | 2/1986 | Bowers | 307/498 |
| 4,845,389 | 7/1989 | Pyndiah et al. | 327/355 |
| 5,323,123 | 6/1994 | Philippe | 330/277 |
| 5,440,261 | 8/1995 | Rydel | 327/333 |
| 5,444,399 | 8/1995 | Shiga | 327/355 |
| 5,459,434 | 10/1995 | Leger et al. | 330/147 |
| 5,517,688 | 5/1996 | Fajen et al. | 327/355 |
| 5,528,769 | 6/1996 | Berenz et al. | 455/333 |

FOREIGN PATENT DOCUMENTS

| | | | |
|---|---|---|---|
| 0549043 | 6/1993 | European Pat. Off. | H03D 7/12 |
| 0618675 | 10/1994 | European Pat. Off. | H03G 3/00 |
| 0638993 | 2/1995 | European Pat. Off. | H03F 1/02 |
| 2734945 | 2/1979 | Germany . | |
| 2168733 | 6/1990 | Japan | H04B 1/16 |

OTHER PUBLICATIONS

European Search Report for European Patent Application No. 96105708.0 mailed Jul. 15, 1996.
H. Morkner et al., 1995 IEEE MTT-S Digest, pp. 527–530, 1995 "A Novel 3V, 7mA PHEMT GaAs Active MMIC Mixer/LNA for Wireless Applications".

*Primary Examiner*—Toan Tran
*Attorney, Agent, or Firm*—Renner, Otto, Boisselle & Sklar, P.L.L.

[57] ABSTRACT

A front-end circuit which receives a first input signal and a second input signal, and outputs an output signal having a differential frequency between the first input signal and the second input signal includes: a first amplifier having an input terminal, a power supply terminal and a virtual ground; a second amplifier having an input terminal, a power supply terminal and a ground; and a mixer having a first and a second input terminals, a power supply terminal and a virtual ground. In the front-end circuit, the virtual ground of the mixer is dc-coupled to the power supply terminal of the first amplifier, the virtual ground of the first amplifier is dc-coupled to the power supply terminal of the second amplifier, the power supply terminal of the first amplifier and the second amplifier are ac-coupled to the first and the second input terminals, respectively, and the input terminal of the first amplifier and the input terminal of the second amplifier receive the first and the second input signals, respectively, and a power supply voltage is supplied to the power supply terminal of the mixer and the ground.

16 Claims, 13 Drawing Sheets

$C_{byp}, C_{cup} > C_{gd}, C_{gs}$

FRONT-END CIRCUIT

BACKGROUND OF THE INVENTION

1. Field of the Invention

The present invention relates generally, as is indicated, to a front-end circuit. More particularly, the present invention relates to a front-end circuit for a radio frequency receiver circuit enabling low power consumption and high performance.

2. Description of the Related Art

Recent years has seen rapid development in the miniaturization of mobile communication equipment. In order to realize such miniaturization, it is necessary to reduce the dissipation current of the equipment, along with miniaturization of parts size themselves. The size of the equipment itself can be reduced if the volume of a battery is reduced, since the battery constitutes a major portion of the size of the mobile communication terminal.

A front-end circuit according to the prior art (as described in, for example, Japanese Laid-Open Patent Publication No. 2-168733) will be described below. FIG. 13 is a circuit diagram of a front-end circuit according to the prior art. As a field effect transistor (hereinafter, referred to as an "FET"), a Schottky gate FET is used. A radio frequency signal of 800 MHz is inputted to the front-end circuit. In FIG. 13, a reference label 1160 designates a local oscillator signal amplifier (hereinafter, referred to as an "LO amplifier"), a reference label 1161 designates a radio frequency signal amplifier (hereinafter, referred to as an "RF amplifier"), and a reference label 1162 designates a frequency converter (hereinafter, referred to as a "mixer"). Reference labels 1701–1703 designate dual-gate FETs which are components included in the circuits 1160–1162. Reference labels 1170 and 1171 designate input matching circuits, reference label 1172 designates an output matching circuit, and reference labels 1130 and 1131 designate inductors for a resonance circuit between stages. Reference label 1710 designates a section which is integrated on a semiconductor substrate. Using frequencies are as follows: LO signal=790 MHz, RF signal=880 MHz, and IF signal=90 MHz. The operation of the front-end circuit having the configuration shown in FIG. 13 will be described below.

The LO amplifier 1160 and the RF amplifier 1161 are matched to characteristic frequencies at respective using frequencies by the input matching circuits 1170 and 1171, respectively. Through a capacitor 1123, an output signal of the LO amplifier is inputted to the second gate of the dual-gate FET 1703 which is one of components included in the mixer 1162. An inductor 1130 is connected to a drain node of the LO amplifier 1160. The inductor 1130, an output capacitance of the dual-gate FET 1701 and an input capacitance of the second gate of the dual-gate FET 1703 form a first parallel resonance circuit. Matching a resonance frequency of the first parallel resonance circuit to the LO signal frequency by adjusting an inductance value of the inductor 1130 maximizes a gain of the LO amplifier 1160, whereby a high gain can be obtained at a low dissipation current.

Through a capacitor 1124, an output signal of the RF amplifier is inputted to the first gate of the dual-gate FET 1703 which is one of components included in the mixer 1162. An inductor 1131 is connected to a drain node of the RF amplifier 1161. The inductor 1131, an output capacitance of the dual-gate FET 1702 and an input capacitance of the first gate of the dual-gate FET 1703 form a second parallel resonance circuit. Matching a resonance frequency of the second parallel resonance circuit to the RF signal frequency by adjusting an inductance value of the inductor 1131 maximizes a gain of the RF amplifier 1161, whereby a high gain can be obtained at a low dissipation current, and an undesired signal (i.e., an image signal) can be rejected. The LO signal and the RF signal inputted to the mixer 1162 are frequency-converted by the dual-gate FET 1703, thus generating an IF signal having a difference frequency between the LO signal frequency and the RF signal frequency. The output matching circuit 1172 is connected to a drain node of the mixer, thereby maximizing the output of the mixer 1162 at the IF frequency. The bias conditions of this circuit is as follows: power supply voltage=3.0 V, dissipation current= 5.0 mA, and power consumption=15 mW. The dissipation current is broken down into as follows: LO amplifier=1.0 mA, RF amplifier=1.5 mA and mixer=2.5 mA.

However, in the front-end circuit discussed above, further reduction in the dissipation currents of the LO amplifier, the RF amplifier and the mixer is difficult since the reduction results in degradation of its performance. Therefore, according to the circuit topology of the prior art, further reduction in the power consumption is difficult.

SUMMARY OF THE INVENTION

According to one aspect of the present invention, a front-end circuit which receives a first input signal and a second input signal, and outputs an output signal having a differential frequency between the first input signal and the second input signal includes: a first amplifier having an input terminal, a power supply terminal and a virtual ground; a second amplifier having an input terminal, a power supply terminal and a ground; and a mixer having a first and a second input terminals, a power supply terminal and a virtual ground, wherein the virtual ground of the mixer is dc-coupled to the power supply terminal of the first amplifier; the virtual ground of the first amplifier is dc-coupled to the power supply terminal of the second amplifier; the power supply terminal of the first amplifier and the second amplifier are ac-coupled to the first and the second input terminals, respectively, and wherein the input terminal of the first amplifier and the input terminal of the second amplifier receive the first and the second input signals, respectively; and a power supply voltage is supplied to the power supply terminal of the mixer and the ground.

In one embodiment of the invention, the virtual ground of the mixer is connected to the power supply terminal of the first amplifier through a first inductor, the virtual ground of the first amplifier is connected to the power supply terminal of the second amplifier through a second inductor, the power supply terminal of the first amplifier is connected to the first input terminal of the mixer through a first capacitor, the power supply terminal of the second amplifier is connected to the second input terminal of the mixer through a second capacitor.

In another embodiment of the invention, the first amplifier includes a first FET and a second FET connected in series, an absolute value of a pinch-off voltage of the first FET is smaller than an absolute value of a pinch-off voltage of the second FET, and a gate of the first FET receives the first input signal; and the second amplifier includes a third FET and a fourth FET connected in series, an absolute value of a pinch-off voltage of the third FET is smaller than an absolute value of a pinch-off voltage of the fourth FET, and a gate of the third FET receives the second input signal.

In still another embodiment of the invention, the mixer includes a fifth FET and a sixth FET, and a gate of the fifth FET and a gate of the sixth FET are connected to the first input terminal and the second input terminal of the mixer.

In still another embodiment of the invention, the mixer includes a fifth FET and a sixth FET, and a gate and a source of the fifth FET are connected to the first input terminal and the second input terminal of the mixer.

In still another embodiment of the invention, a relationship $f1=1/(2\pi\sqrt{(L(C2+C6))})$ is satisfied, where f1 is a frequency of the first input signal, C2 is a gate-drain capacitance of the second FET, and C6 is a gate-source capacitance of the sixth FET.

In still another embodiment of the invention, the first amplifier, the second amplifier and the mixer are formed and integrated on a semiconductor substrate.

According to another aspect of the present invention, a front-end circuit which receives a first input signal and a second input signal, and outputs an output signal having a differential frequency between the first input signal and the second input signal includes: a first amplifier having an input terminal, a power supply terminal and a ground; a second amplifier having an input terminal, a power supply terminal and a ground; and a mixer having a first and a second input terminals, a power supply terminal and a virtual ground, wherein the virtual ground of the mixer is dc-coupled to the power supply terminal of the first and the second amplifier; the power supply terminal of the first amplifier and the second amplifier are ac-coupled to the first and the second input terminals, respectively, and wherein the input terminal of the first amplifier and the input terminal of the second amplifier receive the first and the second input signals, respectively; and a power supply voltage is supplied to the power supply terminal of the mixer and the ground.

In still another embodiment of the invention, the virtual ground of the mixer is connected to the power supply terminal of the first amplifier and the power supply terminal of the second amplifier through a first inductor and a second inductor, respectively, the power supply terminal of the first amplifier is connected to the first input terminal of the mixer through a first capacitor, the power supply terminal of the second amplifier is connected to the second input terminal of the mixer through a second capacitor.

In still another embodiment of the invention, the first amplifier includes a first FET and a second FET connected in series, an absolute value of a pinch-off voltage of the first FET is smaller than an absolute value of a pinch-off voltage of the second FET, and a gate of the first FET receives the first input signal; and the second amplifier includes a third FET and a fourth FET connected in series, an absolute value of a pinch-off voltage of the third FET is smaller than an absolute value of a pinch-off voltage of the fourth FET, and a gate of the third FET receives the second input signal.

In still another embodiment of the invention, the mixer includes a fifth FET and a sixth FET, and a gate of the fifth FET and a gate of the sixth FET are connected to the first input terminal and the second input terminal of the mixer.

In still another embodiment of the invention, the mixer includes a fifth FET and a sixth FET, and a gate and a source of the fifth FET are connected to the first input terminal and the second input terminal of the mixer.

In still another embodiment of the invention, a relationship $f1=1/(2\pi\sqrt{(L(C2+C6))})$ is satisfied, where f1 is a frequency of the first input signal, C2 is a gate-drain capacitance of the second FET, and C6 is a gate-source capacitance of the sixth FET.

In still another embodiment of the invention, the first amplifier, the second amplifier and the mixer are formed and integrated on a semiconductor substrate.

In still another embodiment of the invention, a front-end circuit which receives a first input signal and a second input signal, and outputs an output signal having a differential frequency between the first input signal and the second input signal includes: a first amplifier having an input terminal, a power supply terminal and a virtual ground; a second amplifier having an input terminal, a power supply terminal and a ground; and a mixer having a first and a second input terminals, a power supply terminal and a virtual ground, wherein the power supply terminal of the first amplifier and the second amplifier are ac-coupled to the first and the second input terminals, respectively; the input terminal of the first amplifier and the input terminal of the second amplifier receive the first and the second input signals, respectively, and wherein the first amplifier, the second amplifier and the mixer are connected in series such that currents flowing in the power supply terminals of the first amplifier, the second amplifier and the mixer are substantially same.

In still another embodiment of the invention, a front-end circuit which receives a first input signal and a second input signal, and outputs an output signal having a differential frequency between the first input signal and the second input signal includes: a first amplifier having an input terminal, a power supply terminal and a virtual ground; a second amplifier having an input terminal, a power supply terminal and a ground; and a mixer having a first and a second input terminals, a power supply terminal and a virtual ground, wherein the power supply terminal of the first amplifier and the second amplifier are ac-coupled to the first and the second input terminals, respectively; the input terminal of the first amplifier and the input terminal of the second amplifier receive the first and the second input signals, respectively, and wherein the first amplifier, the second amplifier and the mixer are connected such that a summation of currents flowing in the power supply terminals of the first amplifier and the second amplifier is substantially same as a current flowing in the power supply terminal of the mixer.

Thus, in view of the dissipation current of the front-end circuit, the invention described herein makes possible the advantage of providing a front-end circuit which enables a low dissipation current and a superior characteristics in a radio requency band.

This and other advantages of the present invention will become apparent to those skilled in the art upon reading and understanding the following detailed description with reference to the accompanying figures.

DESCRIPTION OF THE PREFERRED EMBODIMENTS

The present invention will now be described in detail with reference to the drawings, wherein like elements are referred to with like reference labels throughout.

Example 1

Figure 1:
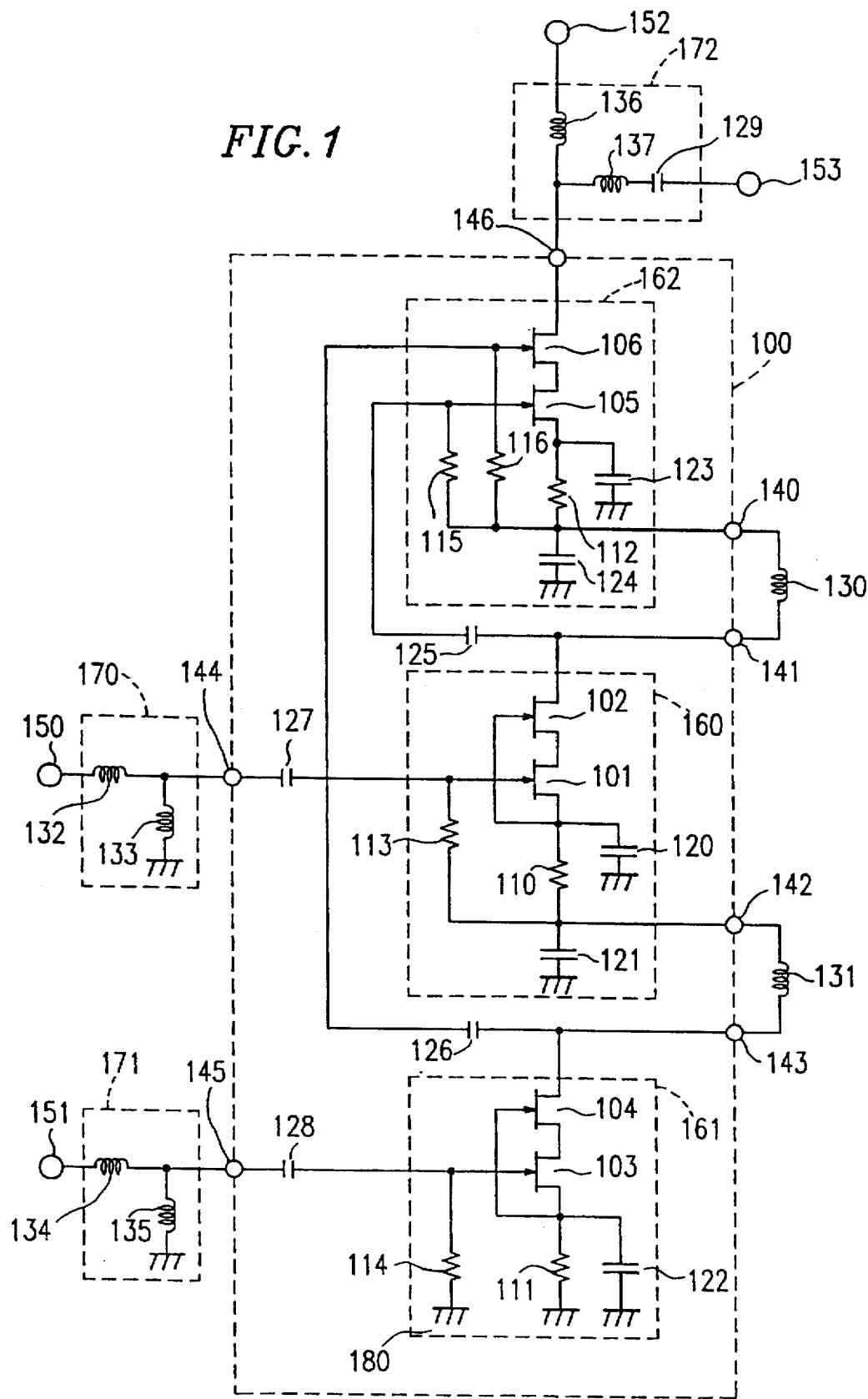
FIG. 1 is a circuit diagram of a first example of a front-end circuit according to the present invention.

FIG. 1 is a circuit diagram of a first example of a front-end circuit according to the present invention. In the front-end circuit 1000 of the first example, a section 100 encircled by the broken line is integrated on a GaAs substrate.

An LO (local oscillator) signal is provided at node 150 and then supplied to node 144 of the front-end circuit 1000 through an input matching circuit 170. A frequency of the input LO signal is about 790 MHz. The input matching circuit 170 includes inductors 132 and 133, thereby matching an input impedance at node 150 at the frequency of the input LO signal.

An RF (radio frequency) signal is provided at node 151 and then supplied to node 145 of the front-end circuit 1000 through an input matching circuit 171. A frequency of the input RF signal is about 880 MHz. The input matching circuit 171 includes inductors 134 and 135, thereby matching an input impedance at node 151 at the frequency of the input RF signal.

The front-end circuit 1000 outputs an IF (intermediate frequency) signal at node 146 by mixing the LO signal inputted at node 150 and the RF signal inputted at node 151. A frequency of the output IF signal is about 90 MHz. The IF signal outputted at node 146 is outputted at node 153 through an output matching circuit 172. The output matching circuit 172 includes inductors 136 and 137, and a capacitor 129. The inductor 137 and the capacitor 129 matches an output impedance at node 153 at the frequency of the IF signal whereby a voltage level of the output IF signal is maximized.

A power supply voltage of +3.0 V against ground 180 is supplied to node 152 and ground 180. The output matching circuit 172 provides dc (direct current) voltage supplied at node 152 to node 146 of the front-end circuit 1000. The inductor 136 performs isolation such that the IF signal do not leak to the power supply. Hereinafter, ground 180 is simply referred to as the "ground".

The front-end circuit 1000 includes an LO amplifier 160, an RF amplifier 161 and a mixer 162. The LO amplifier 160 receives the LO signal through a capacitor 127, amplifies the received LO signal and then outputs the amplified LO signal to the mixer 162 through a capacitor 125. The RF amplifier 161 receives the RF signal through a capacitor 128, amplifies the received RF signal and then outputs the amplified RF signal to the mixer 162 through a capacitor 126. The mixer 162 generates the IF signal by mixing the LO signal and the RF signal output from the LO amplifier 160 and the RF amplifier 161, respectively, and then outputs the generated IF signal at node 146.

By dc voltage supplied to node 146, a current (i.e., a dissipation current of the front-end circuit 1000) flows in the mixer 162, an inductor 130, the LO amplifier 160, an inductor 131 and the RF amplifier 161, in this order, and then reaches the ground. The inductors 130 and 131 are provided for inter-stage matching. Inductance of the inductors 130 and 131 is preferably in a range of about 10 nH–20 nH. The inductor 130 dc-couples the mixer 162 and the LO amplifier 160. The inductor 131 dc-couples the LO amplifier 160 and the RF amplifier 161.

Between node 141 and the ground of the LO amplifier 160, FETs 101 and 102, a resistor 110 and a capacitor 121 are connected in series. A source of the FET 102 is connected to a drain of the FET 101, and a gate of the FET 102 is connected to a source of the FET 101. The LO signal received via the capacitor 127 is inputted to a gate of the FET 101. The source of the FET 101 is connected to the ground by a capacitor 120. The gate of the FET 101 is connected by a resistor 113 to a node to which the resistor 110 and the capacitor 121 are connected.

The LO amplifier 160 receives a power necessary for its operation at node 141. Node 141 functions also as an output terminal of the LO amplifier 160. Node 142 is connected to the ground by the capacitor 121. Therefore, node 142 is ac (alternating current) -grounded, i.e., "ac-coupled" to the ground. In other words, node 142 is grounded for an ac signal having a frequency of 1 Hz–10 Hz or higher, and node 142 is floating from the ground for a dc signal having a frequency of about 1 Hz–10 Hz or lower. A node such as node 141 is referred to as a "power supply terminal" in this specification. A node such as node 142 is referred to as a "virtual ground" in this specification.

Between node 143 and the ground of the RF amplifier 161, FETs 103 and 104 and a resistor 111 are connected in series. A source of the FET 104 is connected to a drain of the FET 103, and a gate of the FET 104 is connected to a source of the FET 103. The RF signal received via the capacitor 128 is inputted to a gate of the FET 103. The source of the FET 103 is connected to the ground by a capacitor 122. The gate of the FET 103 is connected by a resistor 114 to the ground.

The RF amplifier 161 receives a power necessary for its operation at node 143. Node 143 functions also as an output terminal of the RF amplifier 161. In the RF amplifier 161, node 143 is a power supply terminal and the source of the FET 103 is a virtual ground.

Between node 146 and the ground of the mixer 162, FETs 105 and 106, a resistor 112 and a capacitor 124 are connected in series. A source of the FET 106 is connected to a drain of the FET 105. A gate of the FET 105 is connected to node 141 through the capacitor 125 so as to receive the LO signal. A gate of the FET 106 is connected to node 143 through the capacitor 126 so as to receive the RF signal. A source of the FET 105 is connected to the ground by a capacitor 123. The gates of the FETs 105 and 106 are connected by resistors 115 and 116, respectively, to a node to which the resistor 112 and the capacitor 124 are connected.

FETs 105 and 106 of the mixer 162 mix the LO signal and the RF signal and then output a frequency-converted signal at node 146 as the IF signal. The mixer 162 receives a power necessary for its operation at node 146, which is a power supply terminal of the mixer 162. Node 146 functions also as an output terminal of the mixer 162. Node 140 is connected to the ground by a capacitor 124. Therefore, in the mixer 162, node 140 is a virtual ground.

The capacitors 121, 122 and 124 for bypassing a radio frequency signal (e.g., the LO signal, the RF signal, the IF signal) are formed on a semiconductor substrate using semiconductor process as an MIM (metal-insulator-metal) structure. As the insulator for the capacitors 121, 122 and 124, a film having a high dielectric constant is used. In the first example, capacitances of the capacitors 121, 122 and 124 are preferably in a range of about 100 pF–1000 pF.

A dissipation current of the front-end circuit 1000 of the first example flows through node 152 to which an external power supply is connected, node 146, the mixer 162, the inductor 130, the LO amplifier 160, the inductor 131, the RF amplifier 161 and the ground in this order. As a result, dissipation currents of the mixer 162, the LO amplifier 160 and the RF amplifier 161 are commonly utilized. The LO amplifier 160, the RF amplifier 161 and the mixer 162 are isolated by the capacitors 121, 122 and 124, respectively, so as to perform independent RF operations. Resistance values of the resistors 110-112 are set such that the power supply voltage of 3.0 V supplied at node 152 are divided equally by the LO amplifier 160, the RF amplifier 161 and the mixer 162.

Specifically, the dissipation current of the front-end circuit 1000 is 1.8 mA and a power supply voltage of 1.0 V is supplied to each of the LO amplifier 160, the RF amplifier 161 and the mixer 162, resulting in a power consumption of 5.4 mW for the front-end circuit 1000. The dissipation current and the power consumption of the front-end circuit 1000 are one third of those of a front-end circuit according to the prior art.

Operations of the LO amplifier 160, the RF amplifier 161 and the mixer 162 in the front-end circuit 1000 of the first example are described below in detail.

Initially, the operation of the LO amplifier is described. The FET 101 amplifies the inputted LO signal. The FET 102 performs isolation between the mixer 162 and the LO amplifier 160. Specifically, an undesired signal generated at the drain of the FET 102 is bypassed to the ground through the gate of the FET 102 and the capacitor 120. This configuration of the circuit prevents the undesired signal from being mixed in the gate of the FET 101.

Since the main function of the FET 101 is to amplify the LO signal, a high "K-value" and a sufficiently high drain-source voltage are required. Here, the "K-value" is given by partially differentiating a trans conductance gm (i.e., gm=∂ID/∂VGS, where ID is a drain current and VGS is a gate-source voltage) by the gate-source voltage VGS. Thus, the K-value is equal to $\partial^2 ID/\partial VGS^2$.

On the other hand, since the main function of the FET 102 is isolation, a low "on-resistance" is required. This is partly because a gain of the FET 101 is reduced if the on-resistance of the FET 102 is high. Here, the "on-resistance" is a channel resistance between a drain and a source of an FET when the FET is in an on-state by application Of a positive voltage to a gate of the FET.

In the front-end circuit 1000, a pinch-off voltage of the FET 101 is set to be −0.2 V and a pinch-off voltage of the FET 102 is set to be −0.8 V. It is assumed that VPO1 is a pinch-off voltage of an FET (e.g., FET 101) of which gate receives the LO signal, and that VPO2 is a pinch-off voltage of an FET (e.g., FET 102) of which gate is connected to a source of the other FET. It is preferable that a relationship |VPO1|<|VPO2| is satisfied. More preferably, a relationship |VPO2/VPO1|≧2.0 is satisfied. In the present invention, depletion-type FETs are used as the FET 101 and the FET 102.

The following advantages are obtained by setting the pinch-off voltages of the FETs 101 and 102 such that the relationship |VPO1|<|VPO2| is satisfied. Since the K-value of the FET 101 is large, the FET 101 can amplify the LO signal at a high amplification factor. On the other hand, the pinch-off voltage of the FET 102 is high, sufficient isolation is obtained. Therefore, when the above expression is satisfied, the front-end circuit 1000 can realize both the high amplification factor and the high isolation.

The pinch-off voltage is described below in detail. A pinch-off voltage of an FET formed by the ion implantation method is in inverse proportion with a K-value of the FET. That is to say, an FET having a high pinch-off voltage has a small K-value while an FET having a low pinch-off voltage has a large K-value. The larger the K-value is, the larger the amplification factor is. Therefore, using an FET having a small pinch-off voltage advantageously enables the high amplification factor.

Furthermore, the pinch-off voltage is in inverse proportion with the on-resistance. That is to say, an FET having a high pinch-off voltage has a small on-resistance. Therefore, using an FET having a large pinch-off voltage advantageously enables the small on-resistance.

In the front-end circuit 1000, about 70% (i.e., about 0.7 V) of a voltage supplied to the LO amplifier 160 (i.e., a voltage supplied at node 141 and node 142) is supplied to the FET 101 having a lower pinch-off voltage, and about 30% (i.e., about 0.3 V) is supplied to the FET 102 having a higher pinch-off voltage. Since the FET 101 has a small pinch-off voltage of −0.2 V, the FET 101 can operate if a drain-source voltage is equal to or higher than 0.5 V.

Matching between the LO amplifier 160 and the mixer 162 is described below. The inductor 130 connected to the drain of the FET 102, a gate-drain capacitance Cgd of the FET 102 and a gate-source capacitance Cgs of the FET 105 form a parallel resonance circuit, and a resonance frequency f1 of the resonance circuit is represented by an expression:

$$f1 = 1/(2\pi\sqrt{(L(Cgd+Cgs))}),$$

where

L=Inductance of the inductor 130.

By matching the frequency f1 to the frequency of the LO signal, a load impedance of the LO amplifier 160 can be maximized. As a result, a gain of the FET 101 can be maximized. The induction of the above expression for f1 is described below.

Figure 2:
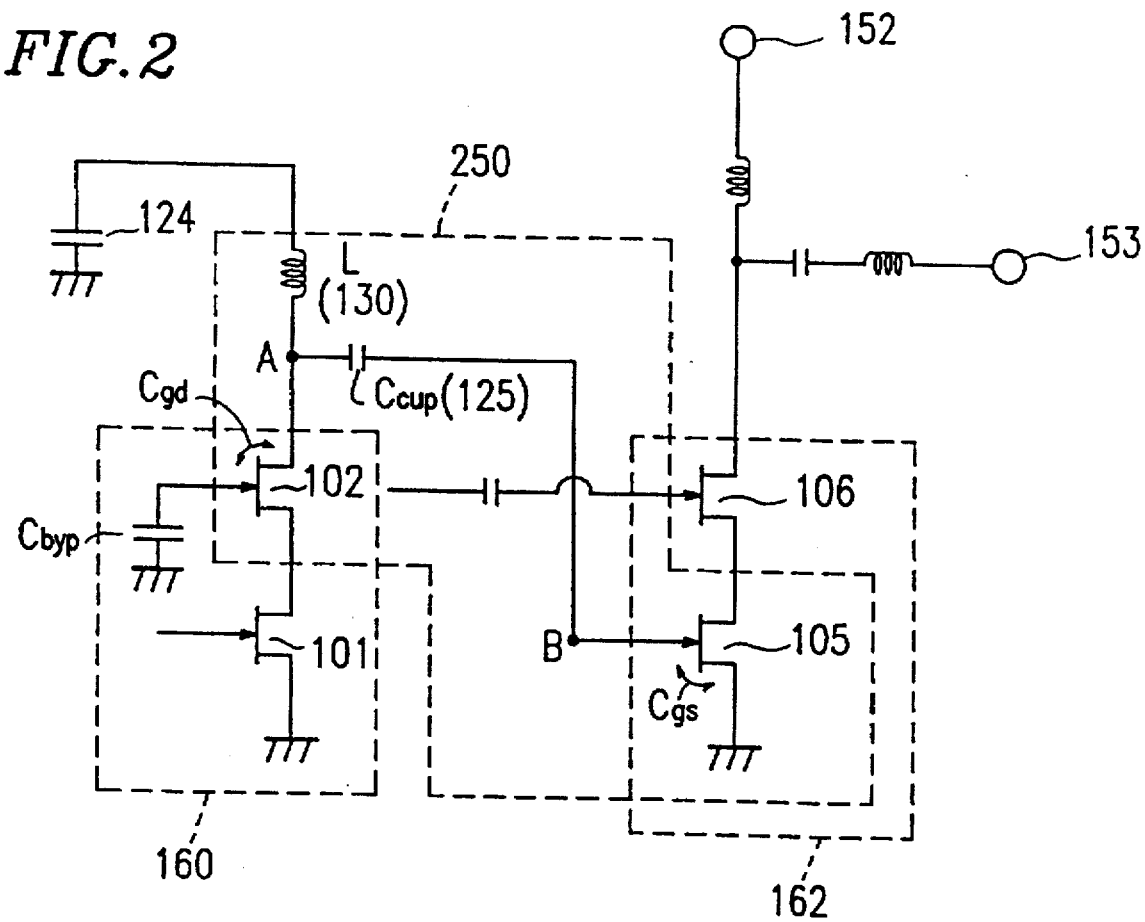
FIG. 2 is a diagram for describing the matching between the LO amplifier 160 and the mixer 162.
Figure 3A:
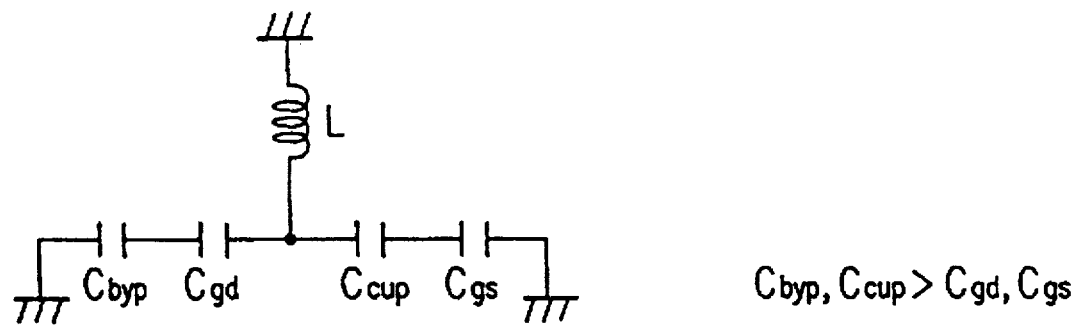
FIGS. 3A–3C are equivalent circuits, each representing the inter-stage resonance circuit in the front-end circuit according to the present invention.
Figure 3B:
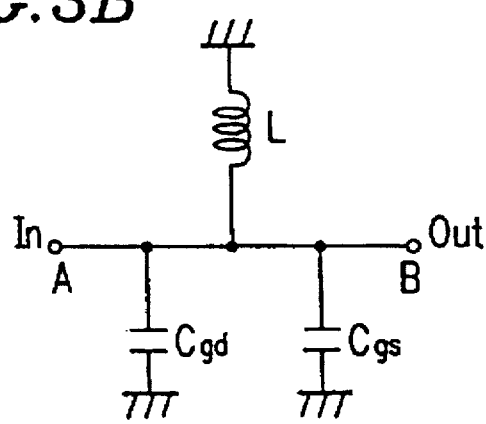
Figure 3C:
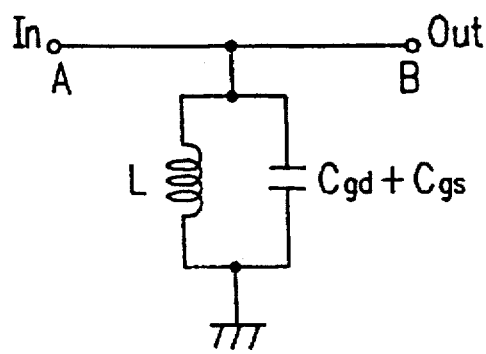

FIG. 2 is a diagram for describing the matching between the LO amplifier 160 and the mixer 162. FIG. 2 illustrates mainly an inter-stage section of the LO amplifier 160 and the mixer 162. In FIG. 2, a section 250 encircled by a broken line forms the resonance circuit between the LO amplifier 160 and the mixer 162. FIGS. 3A–3C are equivalent circuits representing the inter-stage resonance circuit in the front-end circuit according to the present invention. As shown in FIG. 3A, the resonance circuit includes an inductor L (i.e., the inductor 130), and capacitors Cbyp, Cgd, Ccup and Cgs. Here, capacitance values of the capacitors Cbyp and Ccup are larger than those of the capacitors Cgd and Cgs. Therefore, the capacitors Cbyp and Ccup are assumed to be short-circuited for the radio frequency signal. Accordingly, the equivalent circuit shown in FIG. 3A is modified as shown in FIG. 3B. The equivalent circuit shown in FIG. 3B is further simplified as shown in FIG. 3C. The above expression about the frequency f1 represents a resonance frequency of the resonance circuit shown in FIG. 3C. Therefore, if the frequency f1 is equal to the frequency of the LO signal, an impedance of the circuit shown in FIG. 3C is maximized, thus maximizing the gain of the FET 101.

Next, the operation of the RF amplifier 161 is described below. The same as described for the LO amplifier 160 is true with respect to a relationship between pinch-off voltages of the FETs 103 and 104 of the RF amplifier 161. The FET 103 amplifies the RF signal while the FET 104 maintains isolation. In the first example, the pinch-off voltages of the FETs 103 and 104 are −0.2 V and −0.8 V, respectively. It is assumed that VPO1 is a pinch-off voltage of an FET (e.g., FET 103) of which gate receives the RF signal, and that VPO2 is a pinch-off voltage of an FET (e.g., FET 104) of which gate is connected to a source of the other FET. It is preferable that a relationship |VPO1|<|VPO2| is satisfied. More preferably, a relationship |VPO2/VPO1|≧2.0 is satisfied. In the present invention, depletion-type FETs are used as the FET 103 and the FET 104.

A voltage supplied to the RF amplifier 161, i.e., a voltage supplied between node 143 and the ground is 1.0 V. About 0.7 V of this voltage of 1.0 V is supplied to the FET 103 having a lower pinch-off voltage, and about 0.3 V is supplied to the FET 104 having a higher pinch-off voltage.

In order to obtain inter-stage isolation, the FET 104 is set to have a larger pinch-off voltage. The FET 104 prevents the LO signal from leaking from node 151 to an external circuitry through the RF amplifier 161. The LO signal is amplified by the LO amplifier 160 and then supplied to the mixer 162. It is not preferable that the amplified LO signal leaks to the RF amplifier 161 through the mixer 162. According to the present invention, the FET 104 for isolation of the RF amplifier 161 prevents the LO signal from leaking to the RF amplifier 161. This is because of bypassing the LO signal to the ground through the FET 104. As a result of this configuration, the undesired signal of the LO signal does not leak to the external circuitry through the RF amplifier 161.

As described above, in the RF amplifier 161, the FET 104 for isolation and the FET 103 for amplification are connected in series in the same manner as discussed for the LO amplifier 160. In such case, in order to maximize the function of the FETs 103 and 104, the FET 103 is set to have a smaller pinch-off voltage and the FET 104 is set to have a larger pinch-off voltage.

Matching between the RF amplifier 161 and the mixer 162 is described below. The inductor 131 connected to the drain of the FET 104, a gate-drain capacitance Cgd' of the FET 104 and a gate-source capacitance Cgs' of the FET 106 form a parallel resonance circuit, and a resonance frequency f2 of the resonance circuit is represented by an expression:

$$f2=1/(2\pi\sqrt{(L'(Cgd'+Cgs'))}),$$

where

L'=Inductance of the inductor 131.
By matching the frequency f2 to the frequency of the RF signal, a load impedance of the RF amplifier 161 can be maximized. As a result, a gain of the FET 103 can be maximized.

The image signal rejection function of an RF amplifier is discussed below. In general, at a front-end circuit of a receiver, an undesired signal referred to as an image signal is generated against an inputted RF signal. Assuming that the RF signal has a frequency fRF, the image signal has a frequency fIM, and the IF signal has a frequency fIF, the following expression is satisfied:

$$fRF=fLO+fIF \text{ and } fIM=fLO-fIF.$$

In the first example, fRF=880 MHz, fLO=790 MHz and fIF=90 MHz.

In order to eliminate this image signal having fIM, a filter for eliminating the image signal should be provided after the stage of the RF amplifier in the front-end circuit according to the prior art. According to the present invention, however, the resonance circuit formed between the RF amplifier 161 and the mixer 162 enhances the gain of the RF signal, and at the same time, reduces a gain of the image signal. As a result, the present invention has an advantage of rejecting the image signal. In other words, the advantage is that the image signal rejecting filter, which is necessary for the front-end circuit according to the prior art, is not necessary in the front-end circuit according to the present invention. In the first example, an image-rejection ratio of 20 dB is obtained for an image signal of 700 MHz.

Finally, the operation of the mixer 162 will be described below. The FETs 105 and 106 are set to have pinch-off voltages of −0.8 V and −0.2 V, respectively. It is assumed that VPO1 is a pinch-off voltage of an FET (e.g., FET 106) of which gate receives the RF signal, and that VPO2 is a pinch-off voltage of an FET (e.g., FET 105) of which gate receives the LO signal. It is preferable that a relationship |VPO1|<|VPO2| is satisfied. More preferably, a relationship |VPO2/VPO1|≧2.0 is satisfied. In the present invention, depletion-type FETs are used as the FET 105 and the FET 106.

The above relationship of the pinch-off voltages is preferably satisfied for the following reasons. In the mixer 162, the FET 106 amplifies the RF signal, and the FET 105 switches the FET 106 according to the LO signal, thus performing the frequency conversion. Specifically, when the LO signal inputted to the gate of the FET 105 (i.e., the output of the LO amplifier 160) is in a positive half cycle, the FET 106 performs ordinary amplification. On the other hand, when the LO signal inputted to the gate of the FET 105 is in a negative half cycle, the FET 105 is cut off whereby the amplification operation by the FET 106 is stopped. The repetition of this operation of the FETs 105 and 106 results in outputting the IF signal having the difference frequency between the LO signal frequency and the RF signal frequency to the drain of the FET 106 (i.e., node 146).

In order to perform the above operation efficiently, an FET having a large K-value, i.e., having a small pinch-off voltage, is utilized as the FET 106 which contributes to the amplification operation. The FET 105 performs the switching operation and the on-resistance of the FET 105 reduces the amplification function of the FET 106. Therefore, an FET having a high pinch-off voltage is utilized as the FET 105, and thus the FET 105 has a small on-resistance.

In the mixer 162 of the first example, the switching operation of the FET 105 is utilized. Accordingly, an efficiency of the frequency conversion is high and thus a high conversion gain is obtained at a low power consumption.

Figure 4:
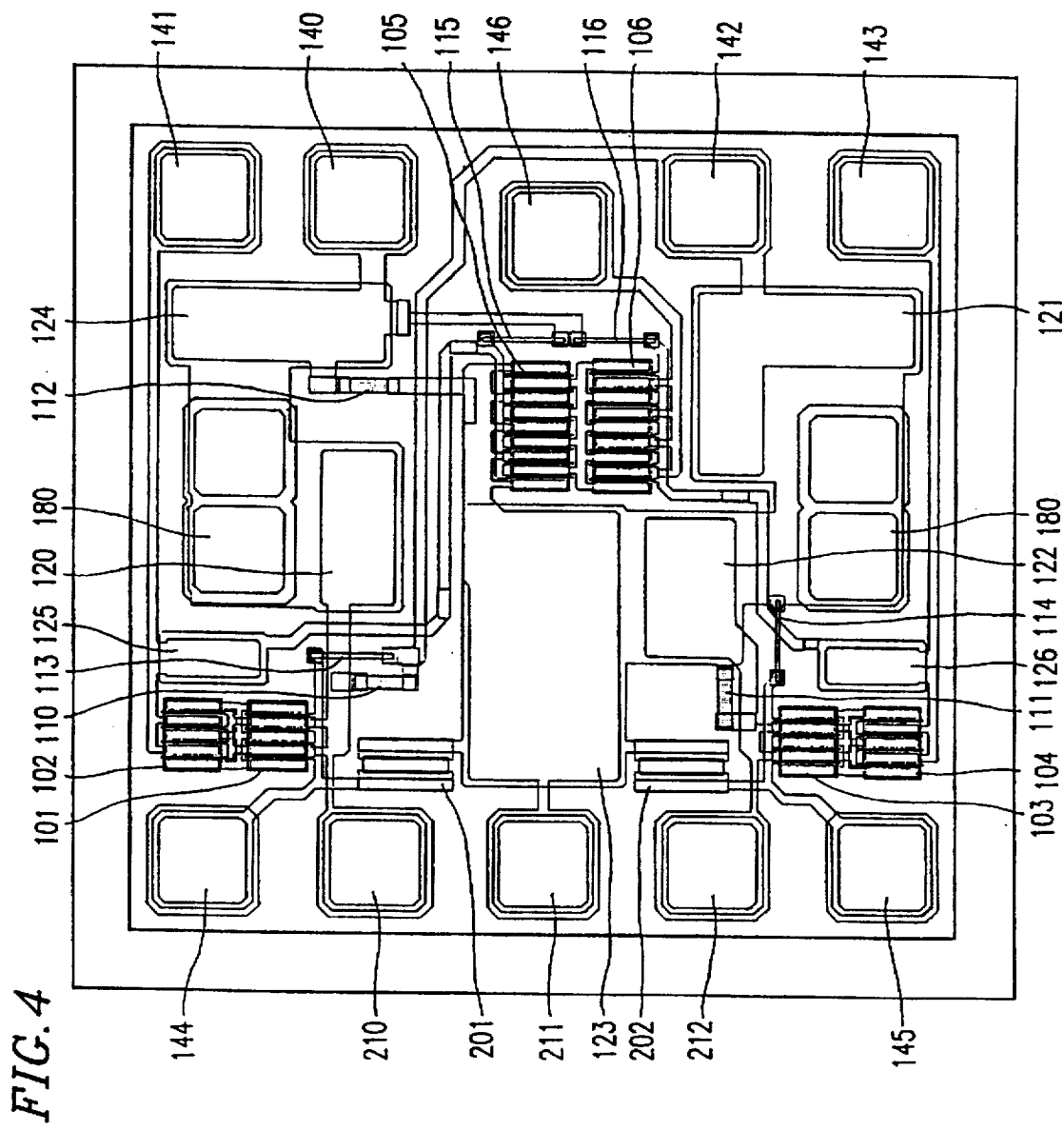
FIG. 4 is a mask layout diagram of the section 100 encircled by a broken line in the front-end circuit 1000 of the first example.

FIG. 4 is a mask layout diagram of the section 100 encircled by a broken line (i.e., the section formed as an IC) in the front-end circuit 1000 of the first example. In FIG. 4, reference labels correspond to those in the circuit diagram shown in FIG. 1. The FETs 101–106 are Schottky gate FETs formed on a GaAs substrate having a gate length of 1.0 μm. A gate width of the FETs 101–104, is 200 μm and a gate width of the FETs 105 and 106 is 400 μm. Reference labels 201 and 202 designate diodes for surge protection. Reference labels 210, 211 and 212 designate pads for measuring a source voltage of the FETs 101, 103 and 105, respectively. A chip of the IC measures 0.8 mm×0.8 mm, and the IC chip is sealed in a small resin mold package having ten pins.

Figure 5:
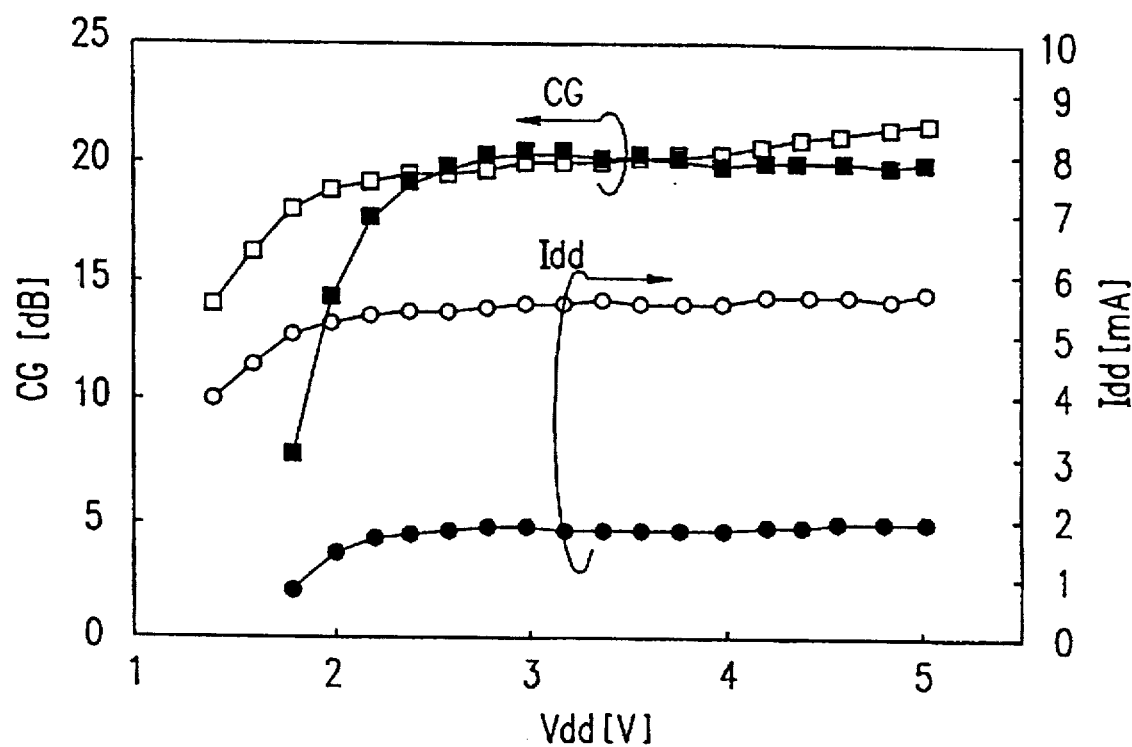
FIG. 5 is a graph showing a conversion gain CG and a dissipation current Idd as a function of a power supply voltage Vdd in the first example.

FIG. 5 is a graph showing a conversion gain CG and a dissipation current Idd as a function of a power supply voltage Vdd in the first example. In FIG. 5, points "■" and "□" indicate the conversion gain CG according to the present invention and the prior art, respectively, and points "●" and "○" indicate the dissipation current Idd according to the present invention and the prior art, respectively. The measurement conditions are as follows:

RF frequency=880 MHz,
LO frequency=790 MHz,
IF frequency=90 MHz,
RF input level=−35 dBm,
LO input level=−15 dBm.

As shown in FIG. 5, the dissipation current of the front-end IC according to the present invention is about one third of the dissipation current of the front-end IC according to the prior art in a range of 2.5–5.0 V of power supply voltage Vdd, while the conversion gain CG of the present invention is almost the same as that of the prior art. In other words, the front-end circuit 1000 of the first example obtains approximately equal performance to the front-end circuit of the prior art, reducing its power consumption to one third of the conventional, circuit. This is mainly because the dissipation currents flowing in the LO amplifier 160, the RF amplifier 161 and the mixer 162 are commonly utilized.

Furthermore, integrating the section 100 encircled by a broken line of the front-end circuit 1000 on a semiconductor substrate allows use of a small package of IC. As a result, a small-sized and high performance front-end circuit is realized.

Example 2

Figure 6:
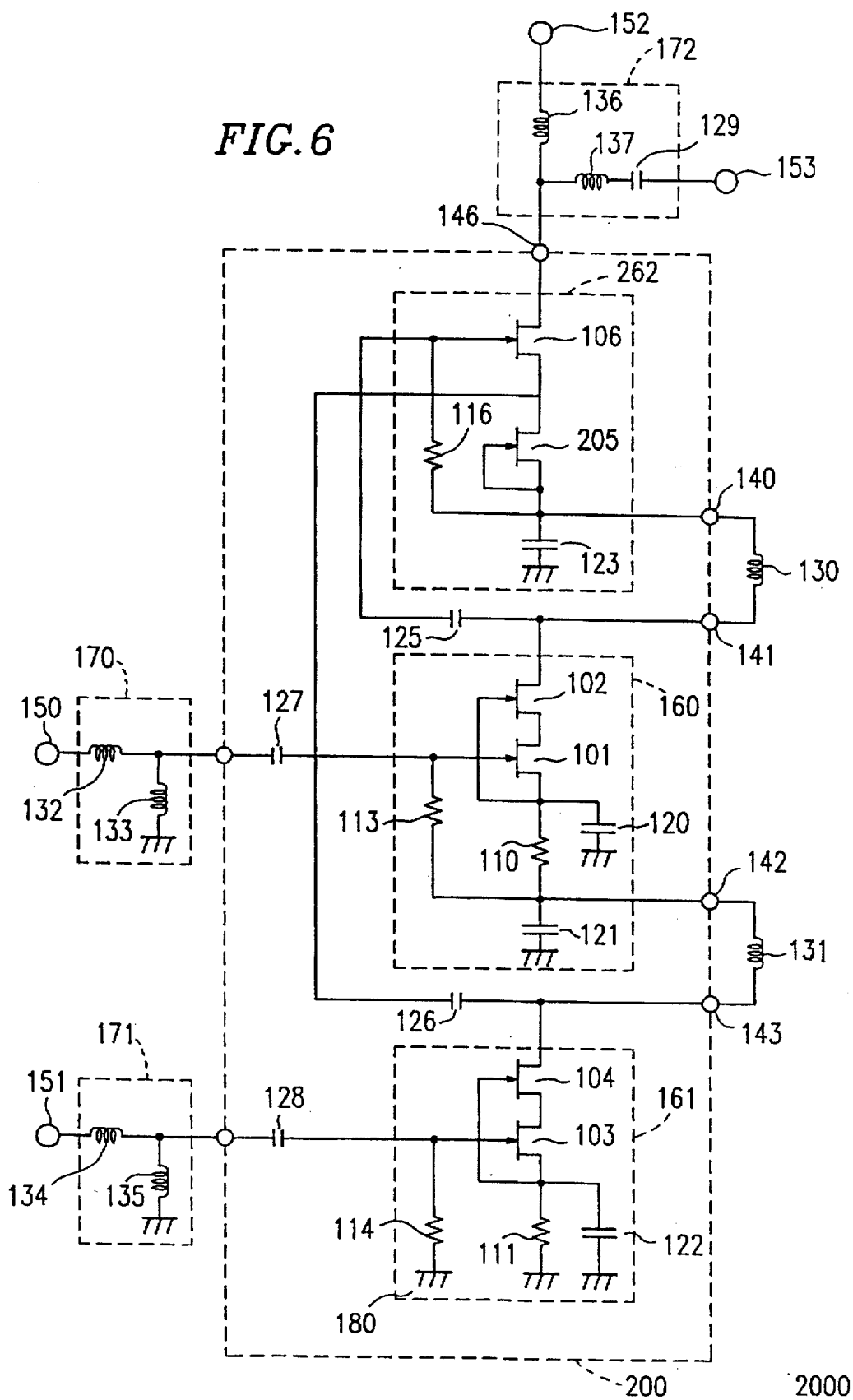
FIG. 6 is a circuit diagram of a second example of a front-end circuit according to the present invention.

FIG. 6 is a circuit diagram of a second example of a front-end circuit according to the present invention. A front-end circuit 2000 of the second example has a similar configuration to the front-end circuit 1000 except a configuration of the mixer 262. A section 200 encircled by the broken line is integrated on a GaAs substrate. In the second example, the LO signal is inputted to the gate of the FET 106, and the RF signal is inputted to the source of the FET 106. In general, the lower input voltage an active device such as an FET receives, the smaller distortion is generated at an output of the active device, for the following reasons. The distortion of basic wave is in proportion with the input voltage, and the n-th order distortion is in inverse proportion with the input voltage to the n-th power. An input impedance of an FET is in proportion with the trans conductance gm in the case of gate input and with (1/gm). Therefore, by adopting source input configuration, a superior distortion characteristics is obtained. An FET 205 functions as an active load and contributes to a low-voltage operation.

Figure 7:
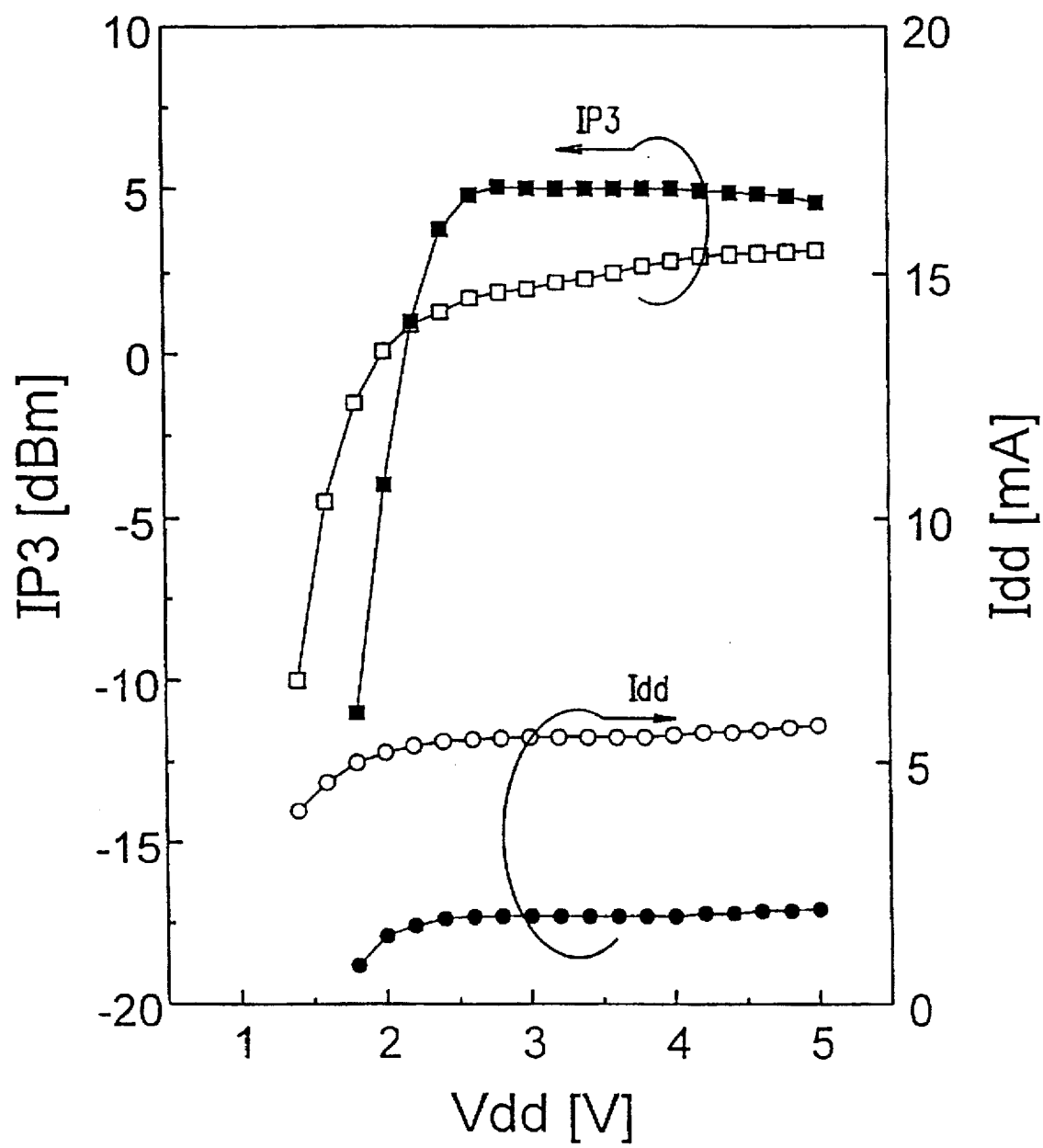
FIG. 7 is a graph showing a third-order intercept point IP3 and a dissipation current Idd as a function of a power supply voltage Vdd in the second example.

FIG. 7 is a graph showing a third-order intercept point IP3 and a dissipation current Idd as a function of a power supply voltage Vdd in the second example. In this specification, the "third-order intercept point IP3" refers to a third order intermodulation distortion output intercept point representing an amount of a third order distortion. In FIG. 7, points "■" and "□" indicate the third-order intercept point IP3 according to the present invention and the prior art, respectively, and points "●" and "○" indicate the dissipation current Idd according to the present invention and the prior art, respectively. The third-order intercept point IP3 is obtained by measuring a level of the third-order distortion at the output terminal (i.e., node 153) when two radio frequency signals having frequency RF1 and RF2 are mixed and then inputted. The measurement conditions are as follows:

Frequency RF1=880.0 MHz,
Frequency RF2=880.3 MHz,
LO frequency=790 MHz,
IF frequency=90 MHz,
Third-order distortion frequency=89.7 MHz,
RF input level=−35 dBm,
LO input level=−15 dBm.

The same measurement conditions for the third-order intercept point IP3 is used in the following examples.

As shown in FIG. 7, the dissipation current of the front-end IC of the second example is about one third of the dissipation current of the front-end IC according to the prior art, while the third-order intercept point IP3 of the present invention is better than that of the prior art by 3 dB.

As described above, according to the second example, it is possible to reduce its power consumption to about one third of the conventional circuit, by commonly utilizing the dissipation currents flowing in the LO amplifier 160, the RF amplifier 161 and the mixer 262. This results in reduction of power consumption to one third of that of the conventional circuit. At the same time, the high-performance front-end IC having the superior distortion characteristics is realized.

Example 3

Figure 8:
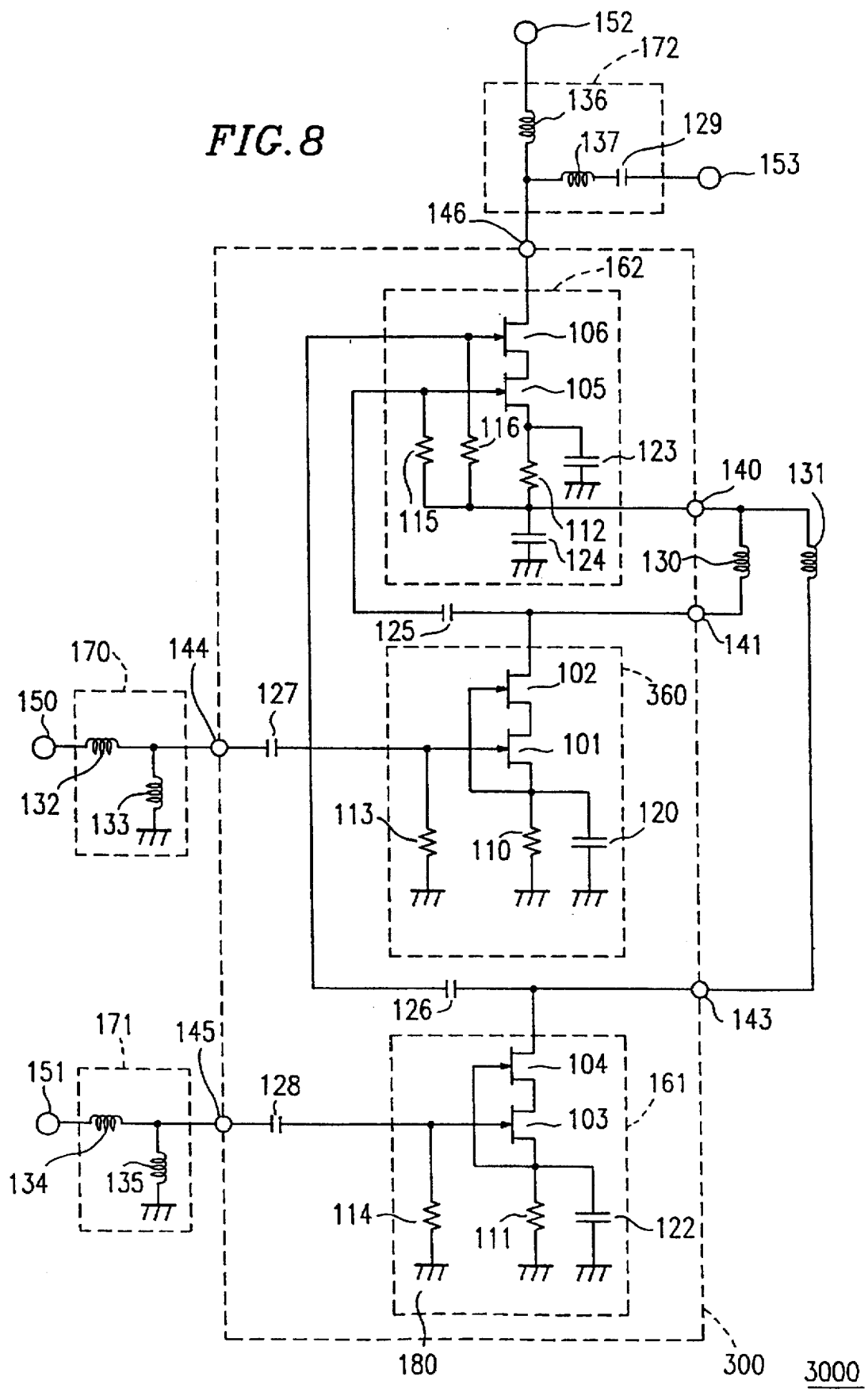
FIG. 8 is a circuit diagram of a third example of a front-end circuit according to the present invention.

FIG. 8 is a circuit diagram of a third example of a front-end circuit according to the present invention. A front-end circuit 3000 of the third example has a similar configuration to that of the front-end circuit 1000 of the first example, with the exception that through the inductor 130, node 140 which is the virtual ground of the mixer 162, is connected to node 141 which is the power supply terminal of the LO amplifier 360; and through the inductor 131, node 140 is connected to node 143 which is the power supply terminal of the RF amplifier 161. A section 300 encircled by a broken line is integrated on a GaAs substrate. In the third example, this circuit topology allows a dissipation current consumed by the mixer 162 to flow in a LO amplifier 360 and the RF amplifier 161 in a divided manner.

In general, a multi-stage circuit requires that a larger dissipation current should flow in a later stage and, accordingly, a larger device size should be provided in the later stage. This is due to a large necessary dynamic range of the device in accordance with a signal power inputted to each stage since it is necessary not to degrade the distortion level when the inputted signal is amplified at each stage. This principal is true with respect to the third example. In other words, increasing the dissipation current of the mixer 162, rather than the RF amplifier 161, contributes to superior RF characteristics more. The circuit topology of the front-end circuit 3000 optimizes the dissipation current consumed at each stage, whereby more superior RF characteristics (especially a distortion characteristics) is obtained.

Furthermore, similarly to the front-end circuit 1000, resonance circuits are formed between stages by the inductors 130 and 131. As a result, in the LO amplifier 360, a high gain is obtained using a small power consumption. In the RF amplifier 161, a high gain and a superior image-rejection ratio are obtained at the same time. The bias conditions of the front-end circuit 3000 are as follows:

Power supply voltage=3.0 V,

Dissipation current=2.5 mA,

Power consumption=7.5 mW.

The dissipation current can be broken down into as follows:

LO amplifier=1.0 mA,

RF amplifier=1.5 mA,

Mixer=2.5 mA.

Figure 9:
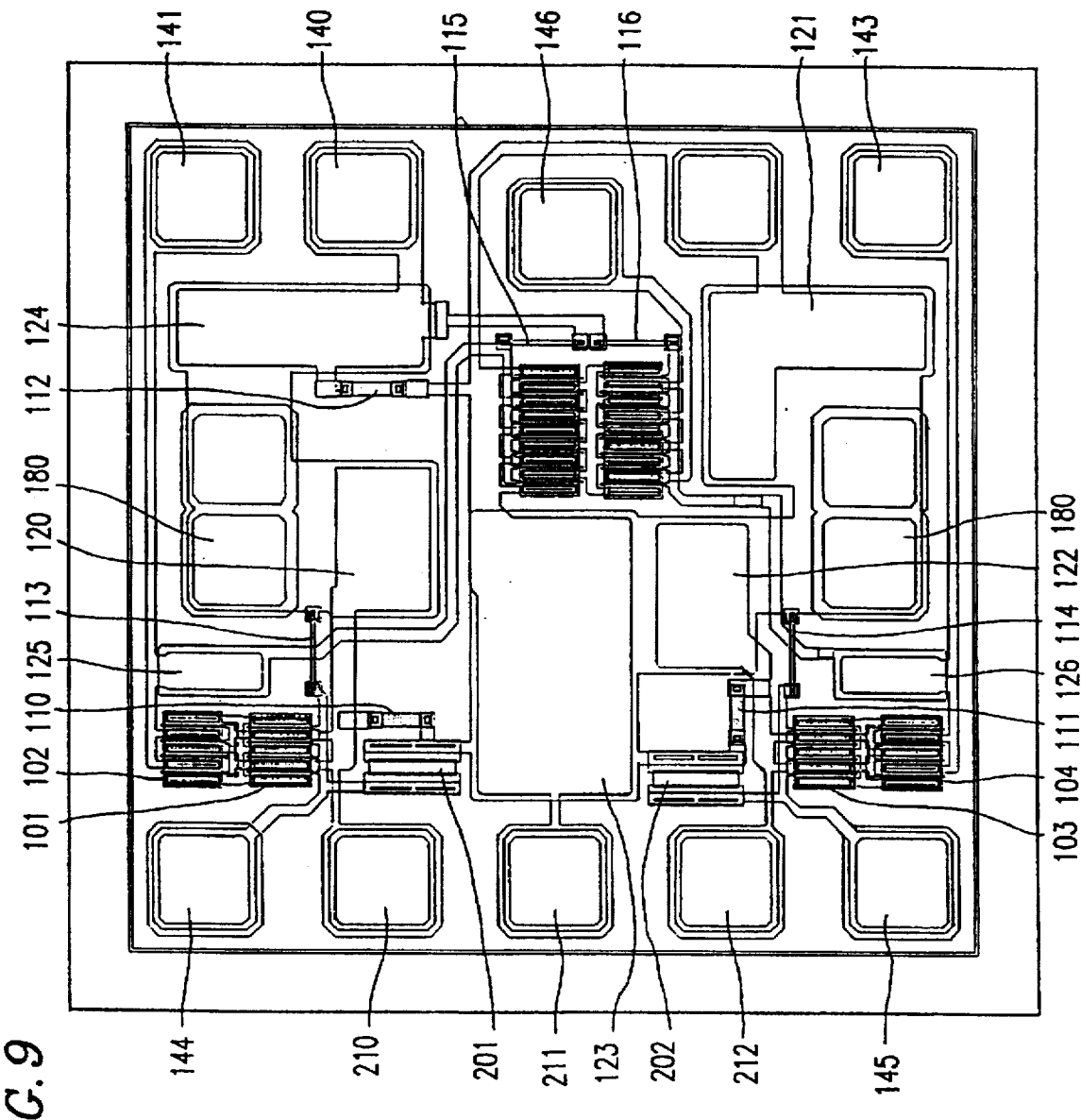
FIG. 9 is a mask layout diagram of the section 300 encircled by a broken line in the front-end circuit 3000 of the third example.

FIG. 9 is a mask layout diagram of the section 300 encircled by a broken line (i.e., the section formed as an IC) in the front-end circuit 3000 of the third example. In FIG. 9, reference labels correspond to those in the circuit diagram shown in FIG. 8. The FETs 101–106 are Schottky gate FETs formed on a GaAs substrate having a gate length of 1.0 µm. A gate width of the FETs 101–104 is 200 µm and a gate width of the FETs 105 and 106 is 400 µm. Reference labels 201 and 202 designate diodes for surge protection. Reference labels 210, 211 and 212 designate pads for measuring a source voltage of the FETs 101, 103 and 105, respectively. A chip of the IC measures 0.8 mm×0.8 mm, and the IC chip is sealed in a small resin mold package having ten pins.

Figure 10:
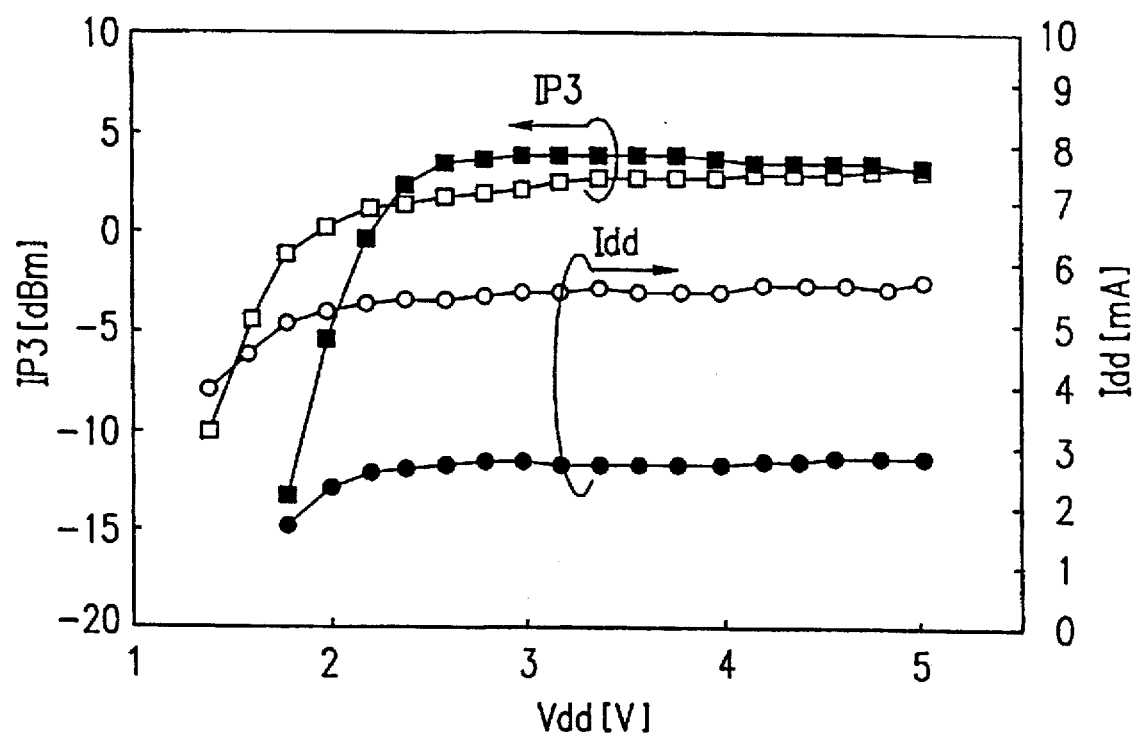
FIG. 10 is a graph showing a third-order intercept point IP3 and a dissipation current Idd as a function of a power supply voltage Vdd in the third example.

FIG. 10 is a graph showing a third-order intercept point IP3 and a dissipation current Idd as a function of a power supply voltage Vdd in the third example. In FIG. 10, points "■" and "□" indicate the third-order intercept point IP3 according to the present invention and the prior art, respectively, and points "●" and "○" indicate the dissipation current Idd according to the present invention and the prior art, respectively.

As shown in FIG. 10, the front-end circuit 3000 obtains a higher third-order intercept point than that of the prior art at a power supply voltage of 3.0 V which is commonly used. At the same time, the dissipation current of the front-end circuit 3000 is one half of that according to the prior art, and thus the power consumption of the front-end circuit 3000 is one half of that of the prior art.

Furthermore, integrating the section 300 encircled by a broken line of the front-end circuit 3000 on a semiconductor substrate allows use of a small package of IC. As a result, a small-sized and high performance front-end circuit is realized.

Example 4

Figure 11:
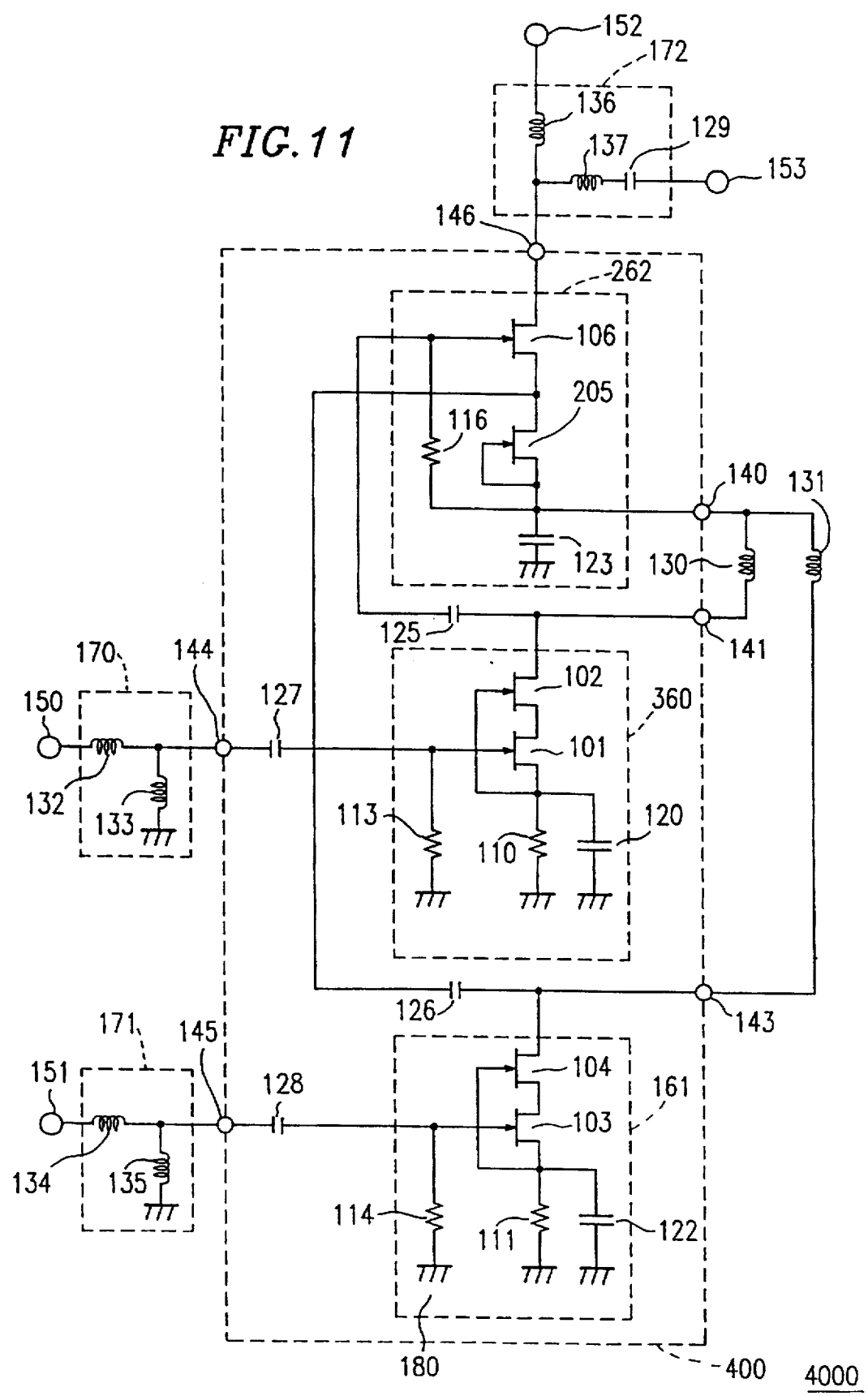
FIG. 11 is a circuit diagram of a fourth example of a front-end circuit according to the present invention.

FIG. 11 is a circuit diagram of a fourth example of a front-end circuit according to the present invention. A front-end circuit 4000 of the fourth example has a similar configuration to the front-end circuit 3000 except for the configuration of the mixer 262. A section 400 encircled by the broken line is integrated on a GaAs substrate.

In the fourth example, the LO signal is inputted to the gate of the FET 106, and the RF signal is inputted to the source of the FET 106. This configuration enables a low distortion. Similarly to the front-end circuit 3000, the circuit topology of the front-end circuit 4000 allows a dissipation current consumed by the mixer 262 to flow in a LO amplifier 360 and the RF amplifier 161 in a divided manner. This topology increases the dissipation current of the mixer 262, whereby more superior distortion characteristics are realized.

Figure 12:
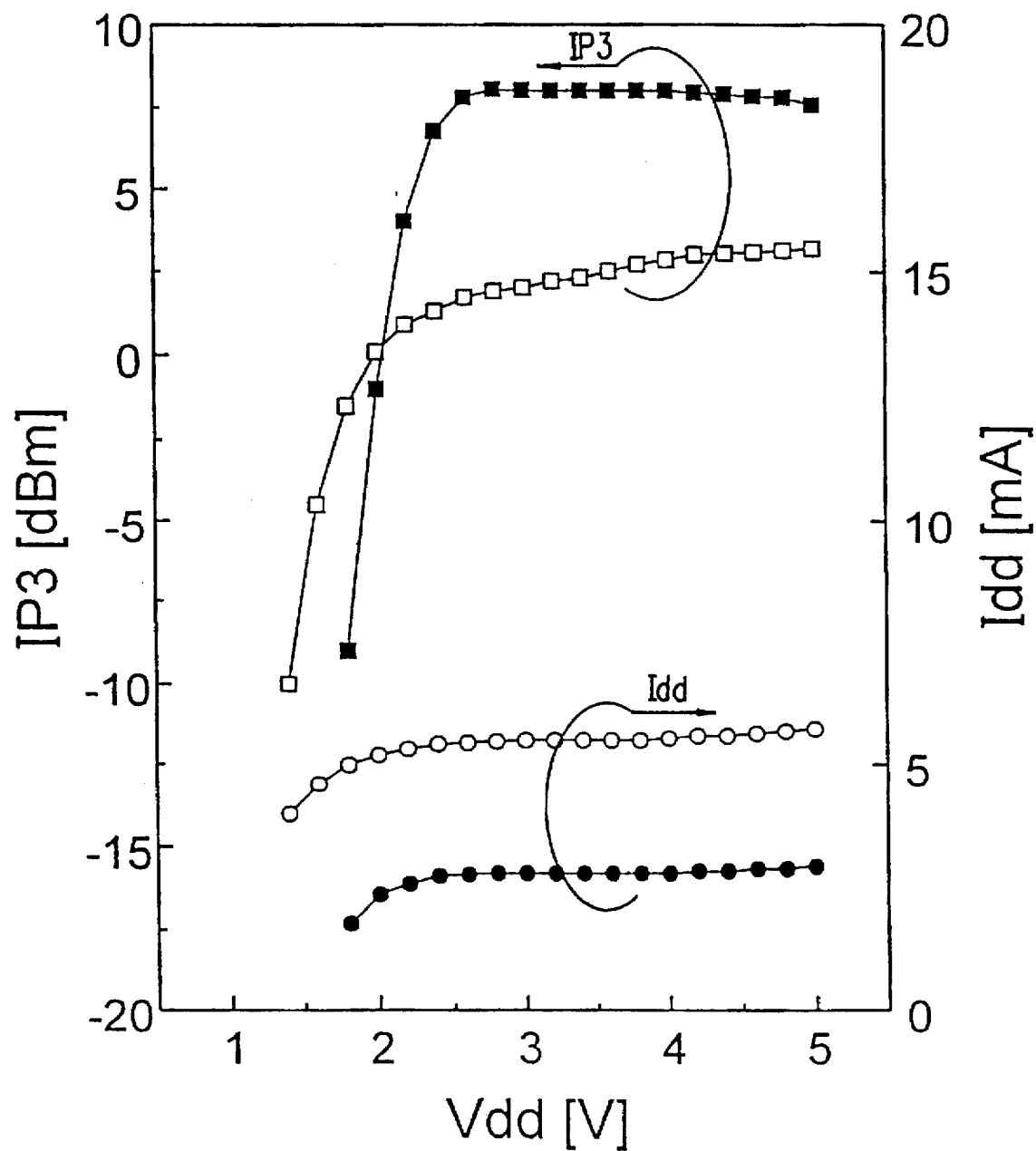
FIG. 12 is a graph showing a third-order intercept point IP3 and a dissipation current Idd as a function of a power supply voltage Vdd in the fourth example.
Figure 13:
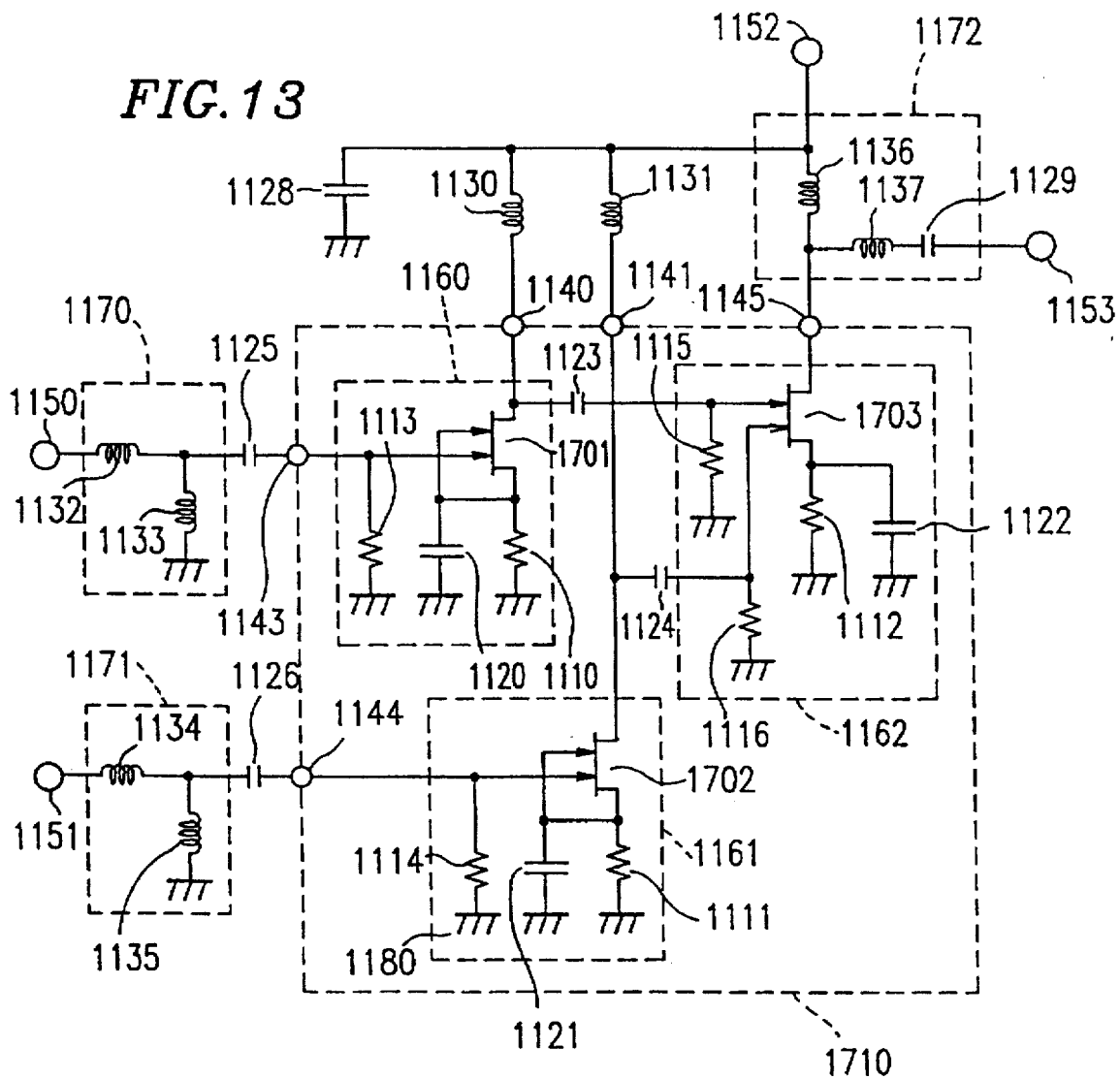
FIG. 13 is a circuit diagram of a front-end circuit according to the prior art.

FIG. 12 is a graph showing a third-order intercept point IP3 and a dissipation current Idd as a function of a power supply voltage Vdd in the fourth example. In FIG. 12, points "■" and "□" indicate the third-order intercept point IP3 according to the present invention and the prior art, respectively, and points "●" and "○" indicate the dissipation current Idd according to the present invention and the prior art, respectively. As shown in FIG. 12, the front-end circuit 4000 obtains a better third-order intercept point than that of the prior art by about 5 dB at a power supply voltage of 3.0 V which is commonly used. Furthermore, in such case, the dissipation current Idd is about one half of that of the prior art. That is to say, the power consumption of the fourth example is also about one half of that of the prior art.

In the first to the fourth examples, the advantages of the present invention can be obtained even if two sections which are connected in series among the mixer, the LO amplifier and the RF amplifier are interchanged as will be appreciated. For example, in the first example, although the mixer 162, the LO amplifier 160 and the RF amplifier 161 are connected in series in this order from the power supply terminal (i.e. node 152) to the ground 180, the series-connected order is not limited to this particular order. Specifically, the mixer 162, the RF amplifier 161 and the LO amplifier 160 can be connected in series in this order.

According to the present invention, the virtual ground of the mixer and the power supply terminal of the LO amplifier are dc-coupled, the virtual ground of the LO amplifier and the power supply terminal of the RF amplifier are dc-coupled, and the external power is supplied to the power supply terminal of the mixer and the ground. By this circuit topology, the dissipation currents of the mixer, the LO amplifier and the RF amplifier are commonly utilized, whereby operation at one third of the dissipation current of the prior art is possible. As a result, the front-end circuit with a low power consumption is realized.

According to the present invention, the virtual ground of the mixer is dc-coupled to the power supply terminals of the LO amplifier and the RF amplifier, and the external power is supplied to the power supply terminal of the mixer and the ground. By this circuit topology, a summation of the dissipation currents flowing in the LO amplifier and the RF amplifier flows in the mixer. As a result, operation at one half of the dissipation current of the prior art is possible. At the same time, the distortion characteristics of the mixer is improved.

According to the present invention, the radio frequency front-end section is miniaturized by integrating the mixer, the LO amplifier and the RF amplifier.

In the LO amplifier and the RF amplifier of the front-end circuit of the present invention, an FET of which gate receives the LO signal or the RF signal has a lower pinch-off voltage than an FET of which gate is ac-connected to the ground. Because of this configuration, the LO amplifier and the RF amplifier obtain a high isolation and a high gain.

According to the present invention, an inductance of the inductor which dc-couples the LO amplifier and the mixer is set such that a resonance circuit formed between the LO amplifier and the mixer has a resonance frequency equal to the LO signal. This enables a high gain at the LO amplifier and a high image rejection.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A front-end circuit which receives a first input signal and a second input signal, and outputs an output signal having a differential frequency between the first input signal and the second input signal comprising:

a first amplifier having an input terminal, a power supply terminal and a virtual ground; a second amplifier having an input terminal, a power supply terminal and a ground; and a mixer having a first and a second input terminals, a power supply terminal and a virtual ground, wherein the virtual ground of the mixer is dc-coupled to the power supply terminal of the first amplifier; the virtual ground of the first amplifier is dc-coupled to the power supply terminal of the second amplifier; the power supply terminal of the first amplifier and the second amplifier are ac-coupled to the first and the second input terminals, respectively, and wherein the input terminal of the first amplifier and the input terminal of the second amplifier receive the first and the second input signals, respectively; and a power supply voltage is supplied to the power supply terminal of the mixer and the ground.

2. A front-end circuit according to claim 1, wherein the virtual ground of the mixer is connected to the power supply terminal of the first amplifier through a first inductor, the virtual ground of the first amplifier is connected to the power supply terminal of the second amplifier through a second inductor, the power supply terminal of the first amplifier is connected to the first input terminal of the mixer through a first capacitor, the power supply terminal of the second amplifier is connected to the second input terminal of the mixer through a second capacitor.

3. A front-end circuit according to claim 2, wherein the first amplifier includes a first FET and a second FET connected in series, an absolute value of a pinch-off voltage of the first FET is smaller than an absolute value of a pinch-off voltage of the second FET, and a gate of the first FET receives the first input signal, and wherein the second amplifier includes a third FET and a fourth FET connected in series, an absolute value of a pinch-off voltage of the third FET is smaller than an absolute value of a pinch-off voltage of the fourth FET, and a gate of the third FET receives the second input signal.

4. A front-end circuit according to claim 3, wherein the mixer includes a fifth FET coupled to a sixth FET, and a gate of the fifth FET and a gate of the sixth FET are connected to the first input terminal and the second input terminal of the mixer, respectively.

5. A front-end circuit according to claim 3, wherein the mixer includes a fifth FET coupled to a sixth FET, and a gate and a source of the fifth FET are connected to the first input terminal and the second input terminal of the mixer, respectively.

6. A front-end circuit according to claim 5, wherein a relationship $f1=1/(2\pi\sqrt{L(C2+C6)})$ is satisfied, where f1 is a frequency of the first input signal, C2 is a gate-drain capacitance of the second FET, C6 is a gate-source capacitance of the sixth FET, and L is an inductance of the first inductor.

7. A front-end circuit according to claim 6, wherein the first amplifier, the second amplifier and the mixer are formed and integrated on a semiconductor substrate.

8. A front-end, circuit which receives a first input signal and a second input signal, and outputs an output signal having a differential frequency between the first input signal and the second input signal comprising:

a first amplifier having an input terminal, a power supply terminal and a ground; a second amplifier having an input terminal, a power supply terminal and a ground; and a mixer having a first and a second input terminals, a power supply terminal and a virtual ground, wherein the virtual ground of the mixer is dc-coupled to the power supply terminal of the first and the second amplifier; the power supply terminal of the first amplifier and the second amplifier are ac-coupled to the first and the second input terminals, respectively, and wherein the input terminal of the first amplifier and the input terminal of the second amplifier receive the first and the second input signals, respectively; and a power supply voltage is supplied to the power supply terminal of the mixer and the ground.

9. A front-end circuit according to claim 8, wherein the virtual ground of the mixer is connected to the power supply terminal of the first amplifier and the power supply terminal of the second amplifier through a first inductor and a second inductor, respectively, the power supply terminal of the first amplifier is connected to the first input terminal of the mixer through a first capacitor, the power supply terminal of the second amplifier is connected to the second input terminal of the mixer through a second capacitor.

10. A front-end circuit according to claim 9, wherein the first amplifier includes a first FET and a second FET connected in series, an absolute value of a pinch-off voltage of the first FET is smaller than an absolute value of a pinch-off voltage of the second FET, and a gate of the first FET receives the first input signal, and wherein the second amplifier includes a third FET and a fourth FET connected in series, an absolute value of a pinch-off voltage of the third FET is smaller than an absolute value of a pinch-off voltage of the fourth FET, and a gate of the third FET receives the second input signal.

11. A front-end circuit according to claim 10, wherein the mixer includes a fifth FET coupled to a sixth FET, and a gate of the fifth FET and a gate of the sixth FET are connected to the first input terminal and the second input terminal of the mixer, respectively.

12. A front-end circuit according to claim 11, wherein the mixer includes a fifth FET coupled to a sixth FET, and a gate and a source of the fifth FET are connected to the first input terminal and the second input terminal of the mixer, respectively.

13. A front-end circuit according to claim 12, wherein a relationship $f1=1/(2\pi\sqrt{L(C2+C6)})$ is satisfied, where f1 is a frequency of the first input signal, C2 is a gate-drain capacitance of the second FET, C6 is a gate-source capacitance of the sixth FET, and L is an inductance of the first inductor.

14. A front-end circuit according to claim 13, wherein the first amplifier, the second amplifier and the mixer are formed and integrated on a semiconductor substrate.

15. A front-end circuit which receives a first input signal and a second input signal, and outputs an output signal having a differential frequency between the first input signal and the second input signal comprising:

a first amplifier having an input terminal, a power supply terminal and a virtual ground; a second amplifier having an input terminal, a power supply terminal and a ground; and a mixer having a first and a second input terminals, a power supply terminal and a virtual ground, wherein the power supply terminal of the first amplifier and the second amplifier are ac-coupled to the first and the second input terminals, respectively; the input terminal of the first amplifier and the input terminal of the second amplifier receive the first and the second input signals, respectively, and wherein the first amplifier, the second amplifier and the mixer are connected in series such that currents flowing in the power supply terminals of the first amplifier, the second amplifier and the mixer are substantially same.

16. A front-end circuit which receives a first input signal and a second input signal, and outputs an output signal having a differential frequency between the first input signal and the second input signal comprising:

a first amplifier having an input terminal, a power supply terminal and a virtual ground; a second amplifier having an input terminal, a power supply terminal and a ground; and a mixer having a first and a second input terminals, a power supply terminal and a virtual ground, wherein the power supply terminal of the first amplifier and the second amplifier are ac-coupled to the first and the second input terminals, respectively; the input terminal of the first amplifier and the input terminal of the second amplifier receive the first and the second input signals, respectively, and wherein the first amplifier, the second amplifier and the mixer are connected such that a summation of currents flowing in the power supply terminals of the first amplifier and the second amplifier is substantially same as a current flowing in the power supply terminal of the mixer.

* * * * *